United States Patent
Tani

(10) Patent No.: US 11,909,382 B2
(45) Date of Patent: Feb. 20, 2024

(54) MULTIPLEXER, FRONT-END MODULE, AND COMMUNICATION DEVICE

(71) Applicant: Murata Manufacturing Co., Ltd., Kyoto (JP)

(72) Inventor: Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 292 days.

(21) Appl. No.: 17/390,016

(22) Filed: Jul. 30, 2021

(65) Prior Publication Data

US 2021/0359665 A1     Nov. 18, 2021

Related U.S. Application Data

(63) Continuation of application No. PCT/JP2020/011508, filed on Mar. 16, 2020.

(30) Foreign Application Priority Data

Mar. 27, 2019   (JP) ................................. 2019-060478

(51) Int. Cl.
```
H03H 9/70       (2006.01)
H03H 9/00       (2006.01)
H03H 9/54       (2006.01)
H04B 1/40       (2015.01)
```
(52) U.S. Cl.
CPC ............ *H03H 9/70* (2013.01); *H03H 9/0004* (2013.01); *H03H 9/542* (2013.01); *H04B 1/40* (2013.01)

(58) Field of Classification Search
CPC ........ H03H 9/70; H03H 9/0004; H03H 9/542; H03H 7/463; H03H 9/706; H03H 9/725; H04B 1/40
See application file for complete search history.

(56) References Cited

U.S. PATENT DOCUMENTS

| | | | |
|---|---|---|---|
| 2008/0042778 A1* | 2/2008 | Jamneala | H03H 9/0004 333/133 |
| 2014/0225680 A1 | 8/2014 | Fujiwara et al. | |
| 2017/0094662 A1* | 3/2017 | Ebihara | H04W 72/0453 |

(Continued)

FOREIGN PATENT DOCUMENTS

| | | |
|---|---|---|
| JP | H07-38376 A | 2/1995 |
| JP | 2004-140508 A | 5/2004 |

(Continued)

OTHER PUBLICATIONS

Machine translation of KR-100790699-B1. (Year: 2023).*

(Continued)

*Primary Examiner* — Jean B Corrielus
(74) *Attorney, Agent, or Firm* — Pearne & Gordon LLP

(57) ABSTRACT

A multiplexer includes a common terminal, a first reception output terminal, a second reception output terminal, a first filter that is connected between the common terminal and the first reception output terminal, a second filter that is connected between the common terminal and the second reception output terminal and that has a passband different from that of the first filter, and an impedance matching circuit that is disposed between the common terminal and the second filter. The impedance matching circuit includes a serial arm resonator disposed in series on a path connecting the common terminal to the second filter.

12 Claims, 11 Drawing Sheets

(56) References Cited

U.S. PATENT DOCUMENTS

| | | |
|---|---|---|
| 2018/0102805 A1* | 4/2018 | Ukon .................. H04B 1/52 |
| 2018/0109243 A1 | 4/2018 | Takamine |
| 2020/0083865 A1 | 3/2020 | Mori |
| 2020/0186126 A1 | 6/2020 | Miyazaki |

FOREIGN PATENT DOCUMENTS

| | | |
|---|---|---|
| JP | 2007-6274 A | 1/2007 |
| WO | 2013/080428 A1 | 6/2013 |
| WO | 2016/208670 A1 | 12/2016 |
| WO | 2018/212048 A1 | 11/2018 |
| WO | 2019/044034 A1 | 3/2019 |

OTHER PUBLICATIONS

Machine translation of WO-2018037884-A1. (Year: 2023).*
International Search Report issued in Application No. PCT/JP2020/011508, dated May 26, 2020.
Written Opinion issued in Application No. PCT/JP2020/011508, dated May 26, 2020.

* cited by examiner

FIG. 3A
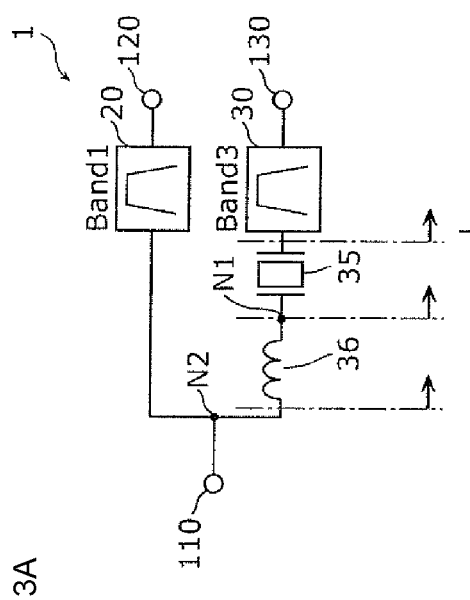
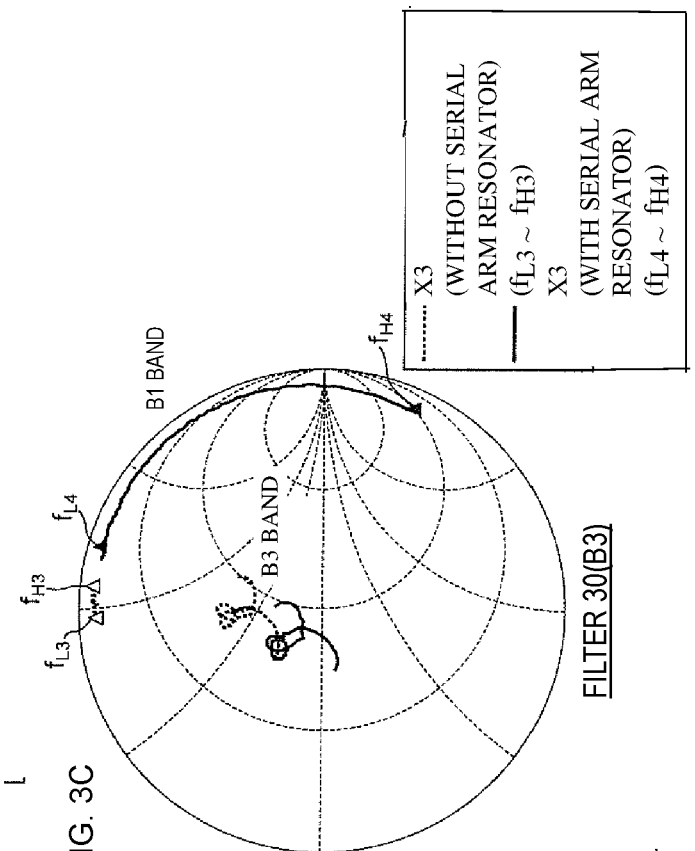
FIG. 3B
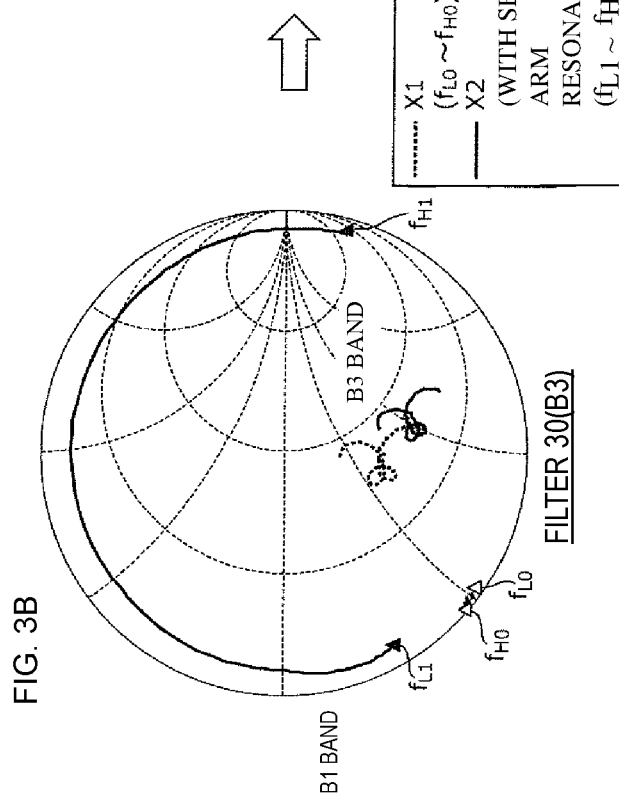
FIG. 3C

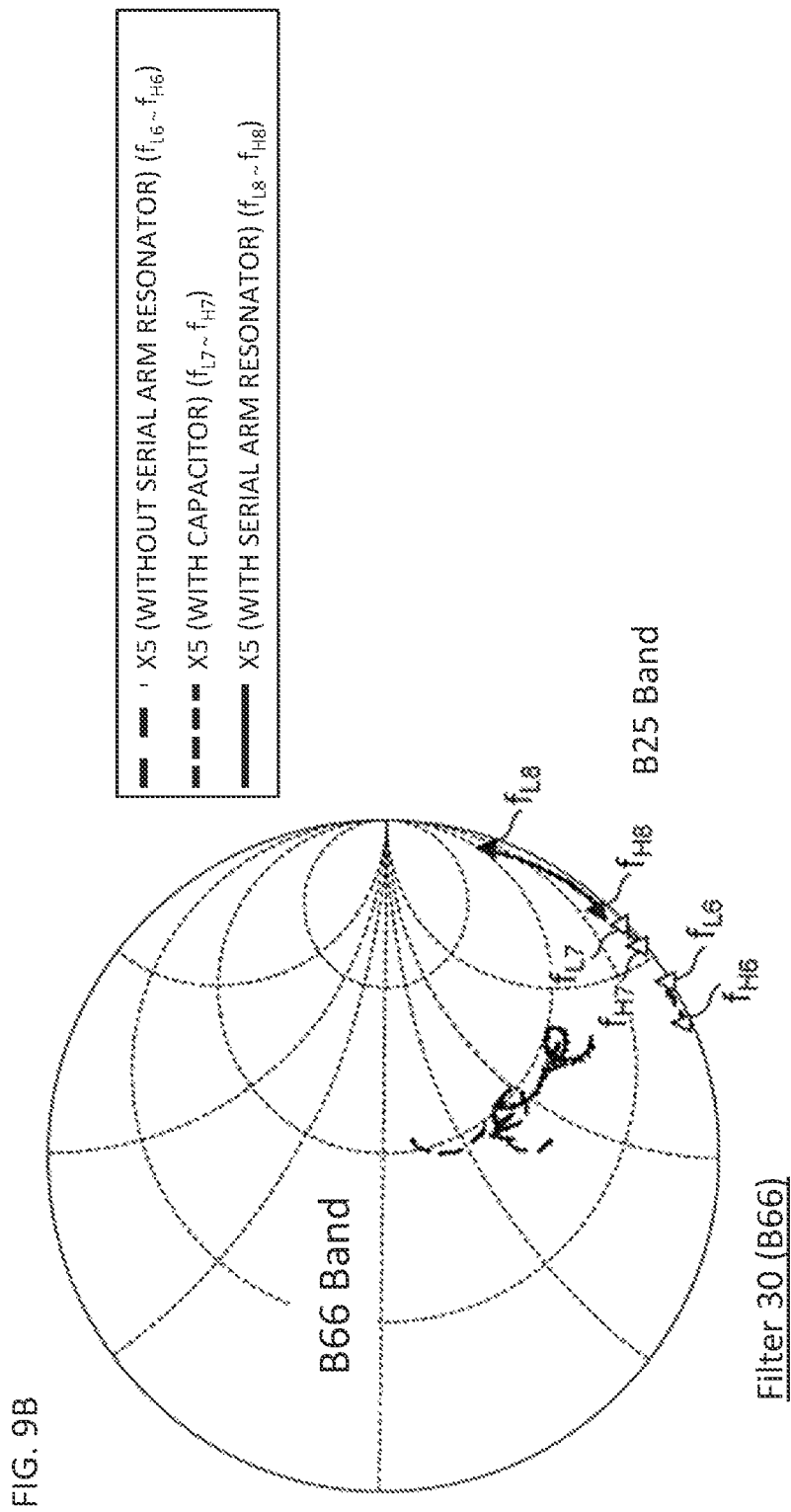

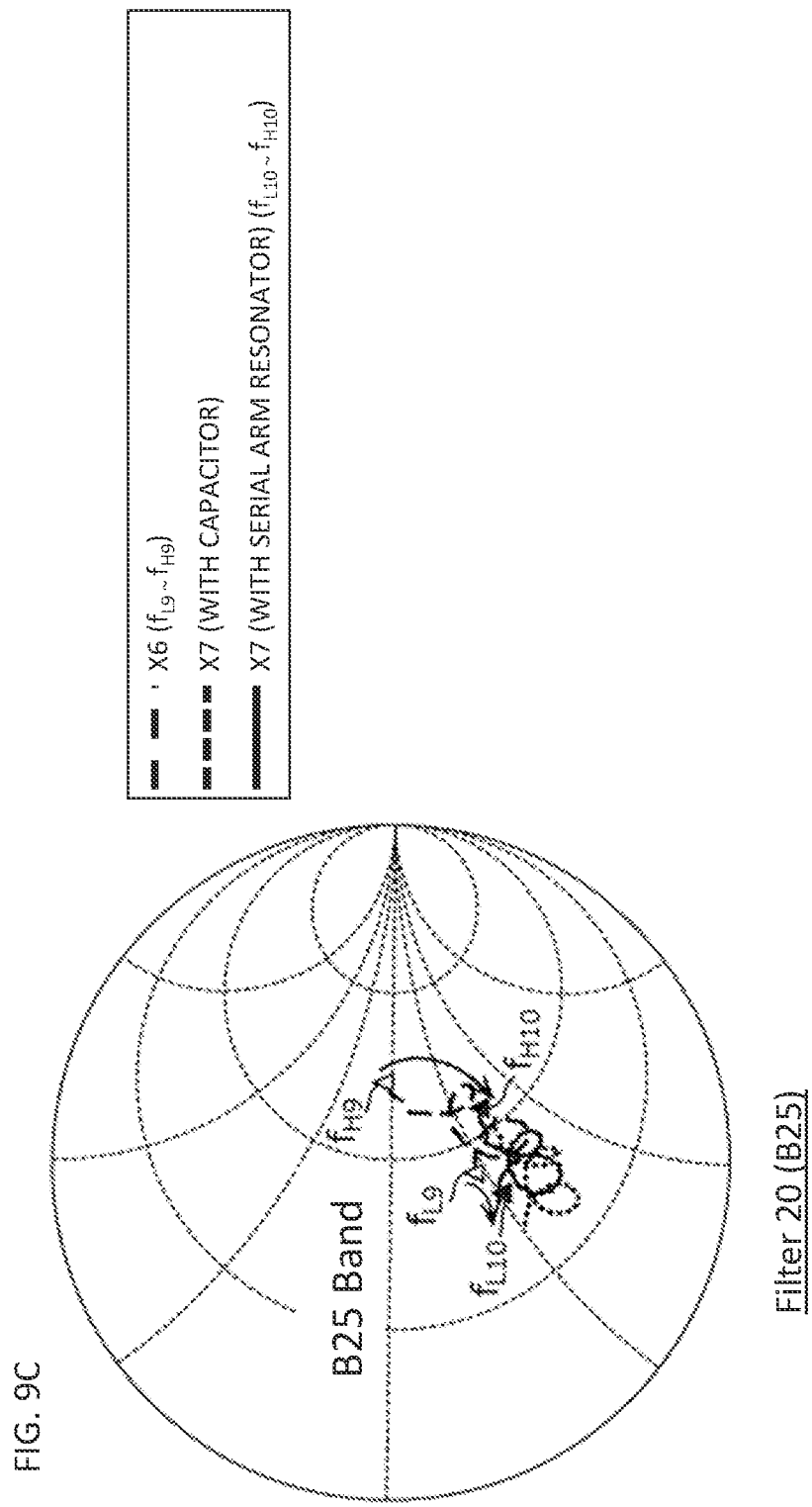

US 11,909,382 B2

MULTIPLEXER, FRONT-END MODULE, AND COMMUNICATION DEVICE

CROSS REFERENCE TO RELATED APPLICATION

This is a continuation of International Application No. PCT/JP2020/011508 filed on Mar. 16, 2020 which claims priority from Japanese Patent Application No. 2019-060478 filed on Mar. 27, 2019. The contents of these applications are incorporated herein by reference in their entireties.

BACKGROUND

The present disclosure relates to a multiplexer, and a front-end module and a communication device which include the multiplexer.

A multiplexer is required which transmits, receives, or transmits/receives two or more radio frequency signals having different frequency bands at the same time with low loss.

International Publication No. 2016/208670 describes a multiplexer having a configuration in which multiple filters are connected to a common terminal, and in which an inductor is disposed between the common terminal and a certain filter of the filters. Specifically, the impedance in the given passband of the certain filter and the impedance in the given passbands of the other filters are made to have the relationship of complex conjugate. This enables a transmit signal and a receive signal to be transmitted/received at the same time with low loss.

A multiplexer, in which multiple filters are connected to a common terminal, is required to have, for example, such impedance characteristics of a certain filter, as seen from the common terminal, that the impedance in the attenuation bands (the passbands of the other filters) is made high while the impedance in the passband (the passband of the certain filter) is made close to the reference impedance.

However, like a multiplexer of the related art, if a passive element having a fixed circuit constant, such as a capacitor or an inductor, is disposed between a common terminal and a filter, the impedance of the filter changes over a wide band uniformly. Therefore, both optimization of the bandpass characteristics of the filter and optimization of the bandpass characteristics of the other filters may fail to be achieved.

BRIEF SUMMARY

The present disclosure is made to solve the issue described above, and an object thereof is to provide a multiplexer, which enables both optimization of the impedance of a filter connected to a common terminal and optimization of the impedance of the other filters to be achieved, and a front-end module and a communication device which include the multiplexer.

To attain the object, a multiplexer according to an aspect of the present disclosure includes a first common terminal, a first input/output terminal, a second input/output terminal, a first filter that is connected between the first common terminal and the first input/output terminal, a second filter that is connected between the first common terminal and the second input/output terminal and that has a passband different from a passband of the first filter, and an impedance matching circuit that is disposed between the first common terminal and the second filter. The impedance matching circuit includes a first acoustic wave resonator that is disposed in series on a path connecting the first common terminal to the second filter.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 3A is a diagram illustrating the circuit configuration of a multiplexer according to the first embodiment;

FIGS. 3B and 3C are Smith charts illustrating the impedance characteristics of a second filter according to the first embodiment;

FIGS. 9B and 9C are Smith charts illustrating the impedance characteristics of filters according to the second embodiment.

DETAILED DESCRIPTION

Embodiments of the present disclosure will be described below in detail by using the drawings. The embodiments below each describe a comprehensive or specific example. Values, shapes, materials, components, arrangement and connection forms of components, which are described in the embodiments below, are exemplary, and are not intended to limit the present disclosure. Among components in the embodiments below, components that are not described in independent claims are described as optional components.

In the present disclosure, "to be connected" encompasses not only the case of direct connection using connection terminals and/or wiring conductors, but also the case of electrical connection through passive elements, such as an inductor and a capacitor.

First Embodiment 1.1 Configuration of Multiplexer 1, Front-End Module 7, and Communication Device 5

Figure 1:
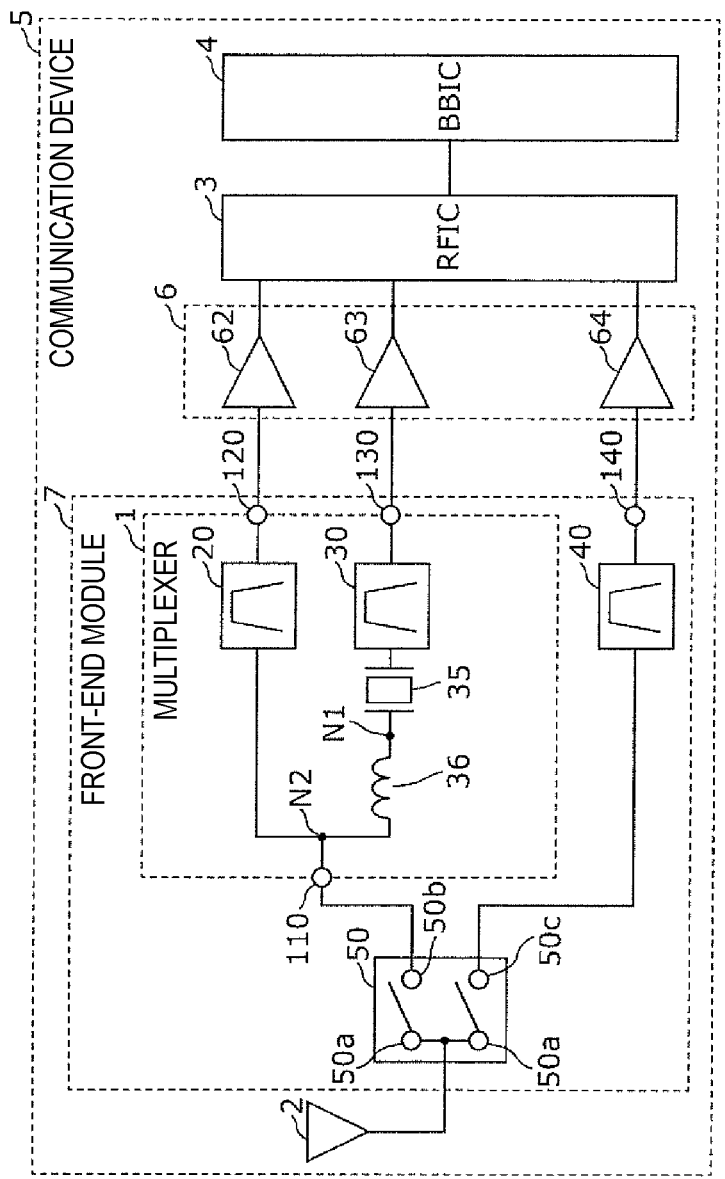
FIG. 1 is a diagram illustrating the circuit configuration of a multiplexer, a front-end module, and a communication device according to a first embodiment.

FIG. 1 is a diagram illustrating the circuit configuration of a multiplexer 1, a front-end module 7, and a communication device 5 according to a first embodiment. As illustrated in FIG. 1, the communication device 5 includes the front-end module 7, an antenna 2, a reception amplifier circuit 6, a radio frequency (RF) signal processing circuit (RFIC) 3, and a baseband signal processing circuit (BBIC) 4.

The RFIC 3 is an RF signal processing circuit which processes radio frequency signals received/transmitted at the antenna 2. Specifically, the RFIC 3 performs signal processing, including down-converting, on radio frequency signals (in this case, radio-frequency receive signals) which are input from the antenna 2 through the front-end module 7 and the reception amplifier circuit 6, and outputs, to the BBIC 4, the receive signals generated through the signal processing. The RFIC 3 may perform signal processing, including upconverting, on transmit signals which are input from the BBIC 4, and may output the radio frequency signals (in this case, radio-frequency transmit signals), which are generated through the signal processing, to the antenna 2 through a transmitting circuit included in the communication device 5.

The BBIC 4 is a circuit which performs signal processing by using an intermediate frequency band whose frequency is lower than that of radio frequency signals transmitted through the front-end module 7. Signals, which have been processed by the BBIC 4, are used, for example, as image signals for image display or as audio signals for calling through a speaker.

The antenna 2 is an antenna element which is connected to the front-end module 7 and which radiates and receives radio frequency signals.

The reception amplifier circuit 6 has low noise amplifiers 62, 63, and 64. The low noise amplifier 62 is disposed between a reception output terminal 120 and the RFIC 3, and amplifies radio-frequency receive signals which are output from a filter 20. The low noise amplifier 63 is disposed between a reception output terminal 130 and the RFIC 3 and amplifies radio-frequency receive signals which are output from a filter 30. The low noise amplifier 64 is disposed between a reception output terminal 140 and the RFIC 3, and amplifies radio-frequency receive signals which are output from a filter 40. The reception amplifier circuit 6 is not necessarily formed of three low noise amplifiers. The reception amplifier circuit 6 may be formed of a single low noise amplifier and a switch for switching connection between the low noise amplifier and the reception output terminals 120, 130, and 140.

The front-end module 7 includes the multiplexer 1, the filter 40, a switch 50, and the reception output terminal 140.

The front-end module 7 and the multiplexer 1 transmit radio frequency signals between the antenna 2 and the RFIC 3.

The switch 50 is a switching circuit which includes a common terminal 50a (second common terminal), a selection terminal 50b (first selection terminal), and a selection terminal 50c (second selection terminal), and which is capable of simultaneous connection between the common terminal 50a and the selection terminal 50b and between the common terminal 50a and the selection terminal 50c.

The filter 40, which is an exemplary third filter, is connected between the selection terminal 50c and the reception output terminal 140 (third input/output terminal), and has a third passband which is different from the passbands of the filters 20 and 30.

The multiplexer 1 includes a common terminal 110 (first common terminal), the reception output terminal (first input/output terminal) 120, the reception output terminal (second input/output terminal) 130, the filters 20 and 30, a serial arm resonator 35, and an inductor 36.

The common terminal 110 is connected to the selection terminal 50b of the switch 50.

The filter 20, which is an exemplary first filter, is connected between the common terminal 110 and the reception output terminal 120, and has a first passband which is different from the passbands of the filters 30 and 40.

The filter 30, which is an exemplary second filter, is connected between the common terminal 110 and the reception output terminal 130, and has a second passband which is different from the passbands of the filters 20 and 40.

The serial arm resonator 35, which is an exemplary impedance matching circuit disposed between the common terminal 110 and the filter 30, is a first acoustic wave resonator disposed in series on a path connecting the common terminal 110 to the filter 30.

The inductor 36, which is an exemplary first inductor, is included in the impedance matching circuit disposed between the common terminal 110 and the filter 30. The inductor 36 is disposed between the common terminal 110 and the serial arm resonator 35, and is connected to the serial arm resonator 35 in series.

That is, the inductor 36, the serial arm resonator 35, and the filter 30 are connected in series between the reception output terminal 130 and node N2 which is a connection point of the filters 20 and 30.

The filters 20, 30, and 40 are, for example, acoustic wave filters using surface acoustic waves (SAWs). Alternatively, the filters 20, 30, and 40 may be acoustic wave filters using bulk acoustic waves (BAWs), LC resonant filters, or dielectric filters.

When the filter 30 is not an acoustic wave resonator, the inductor 36 is not necessarily disposed.

According to the configuration of the multiplexer 1, inductive and capacitive components, which greatly change near the resonant frequency frs of the serial arm resonator 35 and near the anti-resonant frequency fas, may be added to the impedance of the filter 30 as seen from the common terminal 110. This enables the shift direction and the shift amount, in a Smith chart, of the impedance in the passband of the filter 30 to be made different greatly from those of the impedance in the attenuation band of the filter 30.

Thus, the impedance in the passband and the attenuation band of the filter 30 may be optimized individually, enabling both optimization of the impedance of the filter 20 connected to the common terminal 110 and optimization of the impedance of the filter 30 to be achieved. Therefore, both optimization of the bandpass characteristics of the filter 20 and optimization of the bandpass characteristics of the filter 30 may be achieved.

When a radio frequency signal passing through the filter 20, a radio frequency signal passing through the filter 30, and a radio frequency signal passing through the filter 40 are received at the same time, the front-end module 7 having the multiplexer 1 achieves both optimization of the bandpass characteristics of the filter 20 and optimization of the bandpass characteristics of the filter 30.

The multiplexer 1 is a reception demultiplexing circuit which transmits radio-frequency receive signals. Alternatively, the multiplexer provided by the present disclosure may be a transmission multiplexing circuit which transmits radio-frequency transmit signals. Further, the multiplexer may include both the reception demultiplexing circuit and the transmission multiplexing circuit.

In the communication device 5 according to the first embodiment, the antenna 2, the reception amplifier circuit 6, and the BBIC 4 are optional components.

1.2 Impedance Characteristics of Multiplexer 1

Figure 2A:
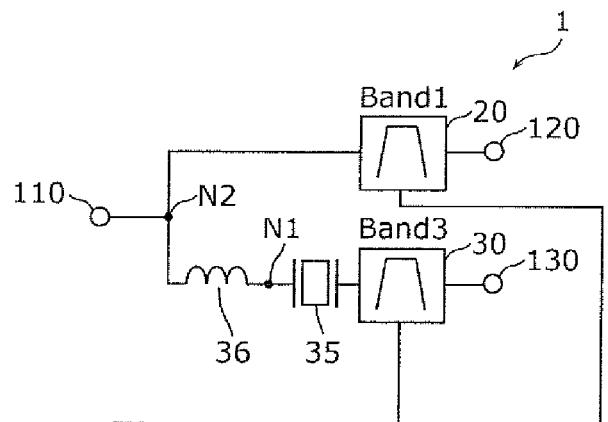
FIG. 2A is a diagram illustrating the circuit configuration of a multiplexer according to the first embodiment.
Figure 2B:
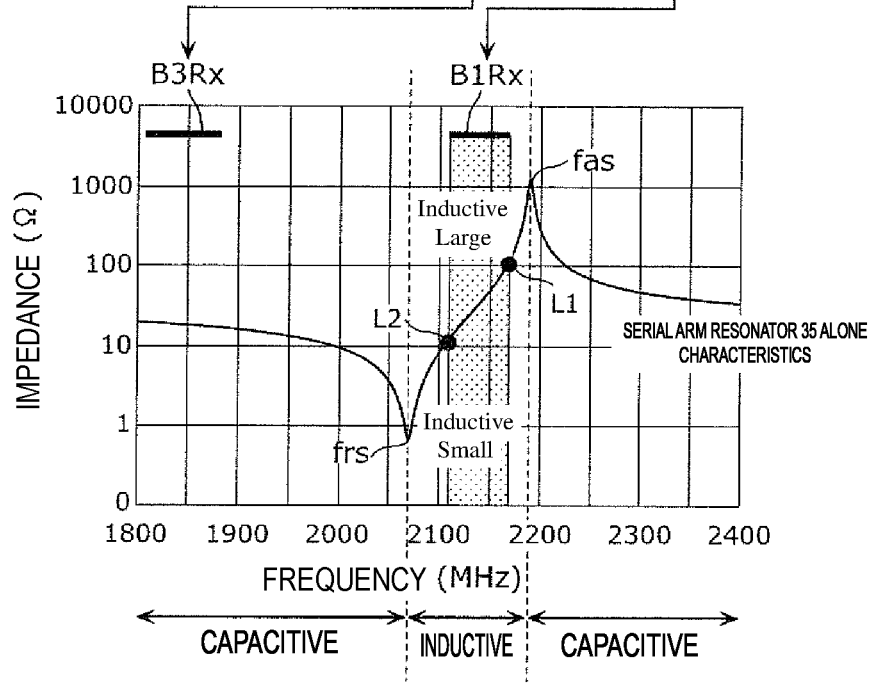
FIG. 2B is a graph illustrating the impedance characteristics of a serial arm resonator according to the first embodiment.

FIG. 2A is a diagram illustrating the circuit configuration of the multiplexer 1 according to the first embodiment. FIG. 2B is a graph illustrating the impedance characteristics of the serial arm resonator 35. As illustrated in FIG. 2A, the filter 20 is applied, for example, to a filter using Band 1 (receive band: 2110-2170 MHz) of Long Term Evolution (LTE) as the first passband. The filter 30 is applied, for example, to a filter using Band 3 (receive band: 1805-1880 MHz) of LTE as the second passband. In this case, the first passband of the filter 20 is positioned on the higher frequency side from the second passband of the filter 30. In the configuration described above, the multiplexer 1 is capable of transmitting a radio-frequency receive signal in Band 1 and a radio-frequency receive signal in Band 3 at the same time.

As illustrated in FIG. 2B, the serial arm resonator 35, which is an acoustic wave resonator, has the resonant frequency frs, at which the impedance is minimum, and the anti-resonant frequency fas, at which the impedance is maximum. The resonant frequency frs is positioned on the lower frequency side from the anti-resonant frequency fas. In the frequency band lower than the resonant frequency frs and the frequency band higher than the anti-resonant frequency fas, the impedance of the serial arm resonator 35 is capacitive. In contrast, in the frequency band higher than the resonant frequency frs and lower than the anti-resonant frequency fas, the impedance of the serial arm resonator 35 is inductive. In the frequency band in which the impedance is inductive, as the frequency approaches the anti-resonant frequency fas, the impedance becomes more inductive; the frequency approaches the resonant frequency frs, the impedance becomes less inductive.

As illustrated in FIG. 2B, the multiplexer 1 according to the first embodiment has the relationship in which the frequency band from the resonant frequency frs to the anti-resonant frequency fas of the serial arm resonator 35 includes the first passband (in FIG. 2B, B1Rx) of the filter 20.

FIG. 3A is a diagram illustrating the circuit configuration of the multiplexer 1 according to the first embodiment. FIGS. 3B and 3C are Smith charts illustrating the impedance characteristics of the filter 30. As illustrated in FIG. 3A, node X1 represents the connection point between the filter 30 and the serial arm resonator 35; node X2 (node N1) represents the connection point between the serial arm resonator 35 and the inductor 36; node X3 represents the connection point between node N2 and the inductor 36. The Smith charts illustrated in FIGS. 3B and 3C illustrate only the impedance in the second passband of the filter 30 (near the reference impedance: in FIGS. 3B and 3C, illustrated as B3 band) and the impedance in the given attenuation band (the first passband of the filter 20) of the filter 30 (near the outermost circle: in FIGS. 3B and 3C, illustrated as B1 band). The Smith charts do not illustrate the impedance in the other bands.

FIG. 3B illustrates the impedance (solid line) of the filter 30, as seen from node X2 with addition of the serial arm resonator 35 (and without connection of the filter 20), and the impedance (broken line) of the filter 30, as seen from node X1 without addition of the serial arm resonator 35 (and without connection of the filter 20).

As illustrated in FIG. 2B, the frequency band from the resonant frequency frs to the anti-resonant frequency fas of the serial arm resonator 35 includes the first passband of the filter 20. That is, the first passband of the filter 20 is included in the inductive region of the serial arm resonator 35. The second passband of the filter 30 is included in the capacitive region of the serial arm resonator 35. Thus, as illustrated in FIG. 3B, the impedance in the second passband of the filter 30, as seen from node X2 with addition of the serial arm resonator 35, is shifted counterclockwise on a constant resistance circle in the Smith chart due to series addition of the capacitive impedance of the serial arm resonator 35.

In contrast, the impedance in the attenuation band (first passband) of the filter 30, as seen from node X2 with addition of the serial arm resonator 35, is shifted clockwise on a constant resistance circle in the Smith chart due to series addition of the inductive impedance of the serial arm resonator 35. More specifically, in the impedance characteristics of the filter 30 as seen from node X2, a small inductive component of the serial arm resonator 35 is added, in series, to the low frequency end of the first passband (B1 band); a large inductive component of the serial arm resonator 35 is added, in series, to the high frequency end of the first passband (B1 band). Therefore, the impedance at the low frequency end of the first passband (B1 band) is shifted little clockwise in the constant resistance circle in the Smith chart (from $f_{L0}$ to $f_{L1}$); the impedance at the high frequency end of the first passband (B1 band) is greatly shifted clockwise on the constant resistance circle in the Smith chart (from $f_{H0}$ to $f_{H1}$).

That is, the frequency band from the resonant frequency frs to the anti-resonant frequency fas of the serial arm resonator 35 is made to cover the passband of the filter 20. Thus, the shift direction and the shift amount, in the Smith chart, of the impedance in the passband (second passband) of the filter 30 are greatly different from those, in the Smith chart, of the impedance in the attenuation band (first passband) of the filter 30.

When the filter 30 is an acoustic wave filter using SAWs, the impedance of the filter 30 alone is capacitive, and both the passband and the attenuation band are positioned in the lower left quadrant or the lower right quadrant in the Smith chart (the broken lines in FIG. 3B). At that time, when the serial arm resonator 35 is used to shift the impedance in the passband (second passband) and the attenuation band (first passband) of the filter 30 as described above, the impedance ($f_{L1}$) at the low frequency end of the attenuation band (first passband) of the filter 30 is shifted to the short side near the outermost circle of the Smith chart; the impedance in the passband (second passband) of the filter 30 is shifted to the high reactance side in the lower right quadrant (capacitive region)

Therefore, when the filter 30 is an acoustic wave filter using SAWs, the inductor 36, which is connected to the serial arm resonator 35 in series, is further used to shift the impedance in the attenuation band (first passband) of the filter 30 to the open side near the outermost circle of the Smith chart without a reduction of the reflection coefficient, and to shift the impedance in the passband (second passband) of the filter 30 to the low reactance side (near the reference impedance).

Specifically, as illustrated in FIG. 3C, in the impedance characteristics of the filter 30 as seen from node X3, the inductor 36, which is disposed in series between node N2 and the serial arm resonator 35, causes the following effect: compared with the impedance, illustrated in FIG. 3B, of the filter 30 as seen from nodes X2 and X1, the impedance in the first passband (B1 band) with addition of the serial arm resonator 35 and the impedance in the first passband (B1 band) without addition of the serial arm resonator 35 are shifted clockwise by the same amount on a constant resistance circle in the Smith chart due to series addition of the inductive impedance. Thus, the impedance at the high frequency end of the attenuation band (first passband) of the filter 30 and the impedance at the low frequency end are shifted to the open side near the outermost circle in the Smith chart (from $f_{L3}$ to $f_{L4}$, from $f_{H3}$ to $f_{H4}$).

In contrast, as illustrated in FIG. 3C, compared with the impedance, illustrated in FIG. 3B, of the filter 30 as seen from nodes X2 and X1, the impedance in the second passband (B3 band) with addition of the serial arm resonator 35 and the impedance in the second passband (B3 band) without addition of the serial arm resonator 35 are shifted clockwise by the same amount on a constant resistance circle in the Smith chart due to series addition of the inductive impedance. Thus, the impedance (the solid line in FIG. 3C) of the second passband (B3 band) of the filter 30 with addition of the serial arm resonator 35 is shifted closer to the reference impedance than the impedance (the broken line in FIG. 3C) of the second passband (B3 band) of the filter 30 without addition of the serial arm resonator 35.

Thus, in the impedance characteristics of the filter 30 as seen from node X3, addition of the serial arm resonator 35 and the inductor 36 enables the impedance in the first passband (B1 band) to be shifted to the high impedance side, while the impedance in the second passband (B3 band) is caused to come closer to the reference impedance.

Figure 4A:
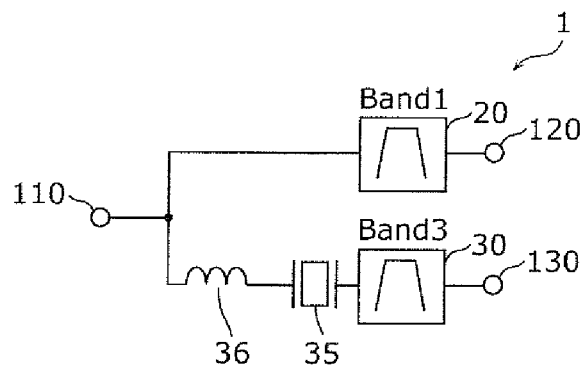
FIG. 4A is a diagram illustrating the circuit configuration of a multiplexer according to the first embodiment.
Figure 4B:
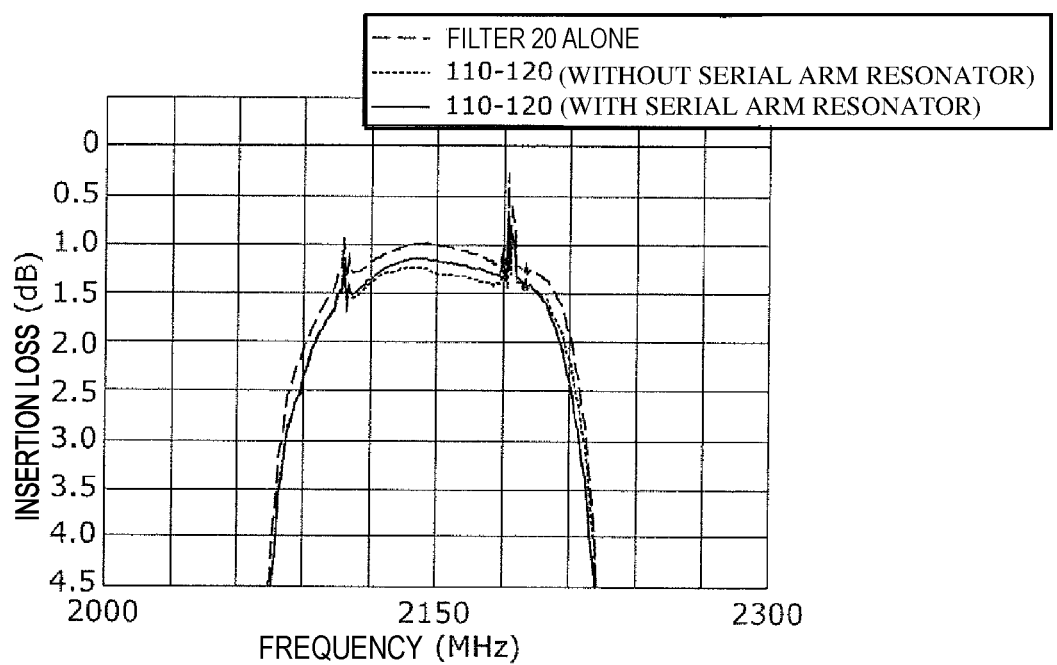
FIG. 4B is a graph illustrating the bandpass characteristics of a first filter according to the first embodiment.

FIG. 4A is a diagram illustrating the circuit configuration of the multiplexer 1 according to the first embodiment. FIG. 4B is a graph illustrating the bandpass characteristics of the filter 20. As illustrated in FIG. 4B, the insertion loss, in the first passband of the filter 20 with addition of the serial arm resonator 35 is improved compared with that of the filter 20 without addition of the serial arm resonator 35.

Therefore, addition of the serial arm resonator 35 causes the attenuation band (first passband) of the filter 30 to be shifted to a high impedance, resulting in improvement in the attenuation characteristics of the filter 30 and improvement in the bandpass characteristics (insertion loss), in the first passband, of the filter 20. That is, both optimization of the impedance of the filter 20 connected to the common terminal 110 and optimization of the impedance of the filter 30 are achieved. In addition, both optimization of the bandpass characteristics (insertion loss) of the filter 20 and optimization of the bandpass characteristics (insertion loss and attenuation characteristics) of the filter 30 are achieved.

The multiplexer provided by the present disclosure needs the inductor 36 if the impedance, in the attenuation band (first passband), of the filter 30 alone is capacitive so as to be positioned in the lower right quadrant of the Smith chart as described above. In contrast, if the impedance, in the attenuation band (first passband), of the filter 30 alone is positioned in the upper right to lower left quadrants in the Smith chart, the inductor 36 is optional. In other words, when the filter 30 is an acoustic wave filter, the inductor 36 is suitable. In contrast, when the filter 30 is not an acoustic wave filter, the inductor 36 is optional.

As illustrated in FIG. 2B, the multiplexer 1 according to the first embodiment is provided on the condition of the relationship in which the frequency band from the resonant frequency frs to the anti-resonant frequency fas of the serial arm resonator 35 includes the first passband of the filter 20. However, this not limiting. Instead of the relationship described above, the frequency band from the resonant frequency frs to the anti-resonant frequency fas of the serial arm resonator 35 may overlap the first passband of the filter 20 at least partially. Alternatively, the anti-resonant frequency fas of the serial arm resonator 35 may be included in the first passband of the filter 20.

Even in these relationships, in the impedance characteristics of the filter 30 as seen from the common terminal 110, a capacitive component that changes little may be added to the impedance in the passband (second passband); inductive and capacitive components that greatly change near the resonant frequency frs and near the anti-resonant frequency fas of the serial arm resonator 35 may be added to the impedance in the attenuation band (first bandpass). Thus, the shift direction and the shift amount, in the Smith chart, of the passband of the filter 30 may be greatly different from those of the impedance in the attenuation band of the filter 30. Therefore, both optimization of the impedance of the filter 20 connected to the common terminal 110 and optimization of the impedance of the filter 30 may be achieved.

1.3 Configuration of Multiplexer 1A according to a Modified Example

Figure 5A:
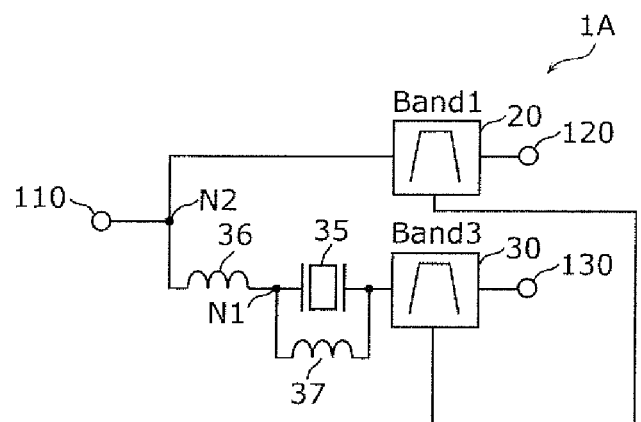
FIG. 5A is a diagram illustrating the circuit configuration of a multiplexer according to a modified example of the first embodiment.
Figure 5B:
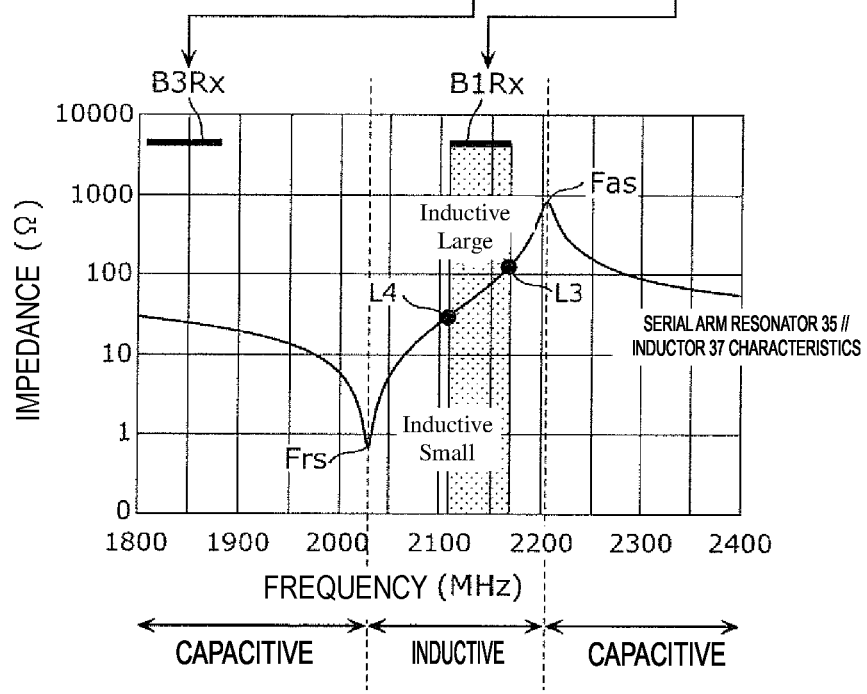
FIG. 5B is a graph illustrating the impedance characteristics of a parallel combination of a serial arm resonator and a second inductor according to the modified example of the first embodiment.

FIG. 5A is a diagram illustrating the circuit configuration of a multiplexer 1A according to a modified example of the first embodiment. FIG. 5B is a graph illustrating the impedance characteristics of a parallel combination of the serial arm resonator 35 and an inductor 37.

As illustrated in FIG. 5A, the multiplexer 1A includes the common terminal 110, the reception output terminals 120 and 130, the filters 20 and 30, the serial arm resonator 35, and the inductors 36 and 37. The multiplexer 1A according to the modified example is different from the multiplexer 1 according to the first embodiment in that the inductor 37 is added. The multiplexer 1A according to the modified example will be described below, mainly in different points, not in the same points, from those in the multiplexer 1 according to the first embodiment.

The inductor 37, which is an exemplary second inductor, is included in the impedance matching circuit disposed between the common terminal 110 and the filter 30. The inductor 37 is disposed between the common terminal 110 and the filter 30, and is connected to the serial arm resonator 35 in parallel.

1.4 Impedance Characteristics of Multiplexer 1A According to the Modified Example As illustrated in FIG. 5B, in the multiplexer 1A according to the modified example, the frequency band from the resonant frequency Frs to the anti-resonant frequency Fas of the parallel combination, in which the serial arm resonator 35 is connected to the inductor 37 in parallel, includes the first passband (in FIG. 2B, B1Rx) of the filter 20. The bandwidth from the resonant frequency Frs to the anti-resonant frequency Fas of the parallel combination is larger than the bandwidth from the resonant frequency frs to the anti-resonant frequency fas of the serial arm resonator 35 alone.

Thus, the difference between inductance L3 at the high frequency end of the passband (B1Rx) of the filter 20 and inductance L4 at the low frequency end, which is illustrated in FIG. 5B, is smaller than the difference between inductance L1 at the high frequency end of the passband (B1Rx) of the filter 20 and inductance L2 at the low frequency end, which is illustrated in FIG. 2B.

Figure 6A:
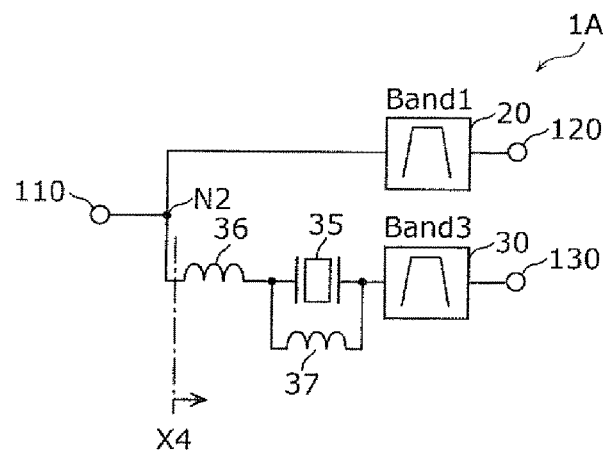
FIG. 6A is a diagram illustrating the circuit configuration of a multiplexer according to the modified example of the first embodiment.
Figure 6B:
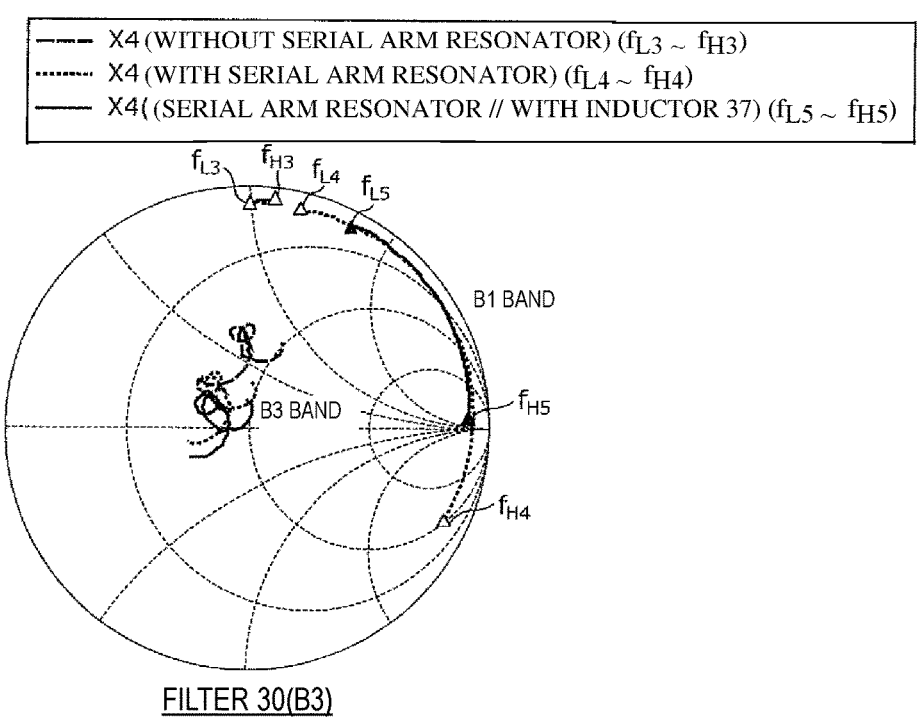
FIG. 6B is a Smith chart illustrating the impedance characteristics of a second filter according to the modified example of the first embodiment.

FIG. 6A is a diagram illustrating the circuit configuration of the multiplexer 1A according to the modified example of the first embodiment. FIG. 6B is a Smith chart illustrating the impedance characteristics of the filter 30. As illustrated in FIG. 6A, a node between node N2 and the inductor 36 is referred to as node X4. The Smith chart in FIG. 6B illustrates only the impedance in the second passband of the filter 30 (near the reference impedance: in FIG. 6B, illustrated as B3 band) and the impedance in the given attenuation band (the first passband of the filter 20) of the filter 30 (near the outermost circle: in FIG. 6B, illustrated as B1 band). The Smith chart does not illustrate the impedance of the other bands.

According to the configuration described above, in the impedance characteristics of the filter 30 as seen from node X4, the impedance of the first passband (B1 band) with addition of the parallel combination ($f_{L5}$ to $f_{H5}$) has a change width smaller than that of the impedance of the first passband (B1 band) without addition of the inductor 37 and with addition of the serial arm resonator 35 ($f_{L4}$ to $f_{H4}$).

This is because the difference between inductance L3 at the high frequency end of the first passband and inductance L4 at the low frequency end, which are added by the parallel combination in the multiplexer 1A, is smaller than the difference between inductance L1 at the high frequency end of the first passband and inductance L2 at the low frequency end, which are added by the serial arm resonator 35 in the multiplexer 1.

That is, in the impedance characteristics of the filter 30 as seen from node X4, the impedance of the first passband (B1 band) with addition of the parallel combination of the serial arm resonator 35 and the inductor 37 ($f_{L5}$ to $f_{H5}$) does not make the reflection coefficient smaller compared with the impedance of the first passband (B1 band) with addition of only the serial arm resonator 35 ($f_{L4}$ to $f_{H4}$). Further, the concentration to the open side may be improved.

Figure 7A:
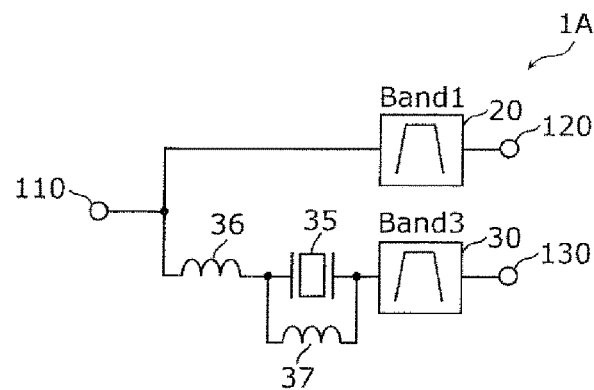
FIG. 7A is a diagram illustrating the circuit configuration of a multiplexer according to the modified example of the first embodiment.
Figure 7B:
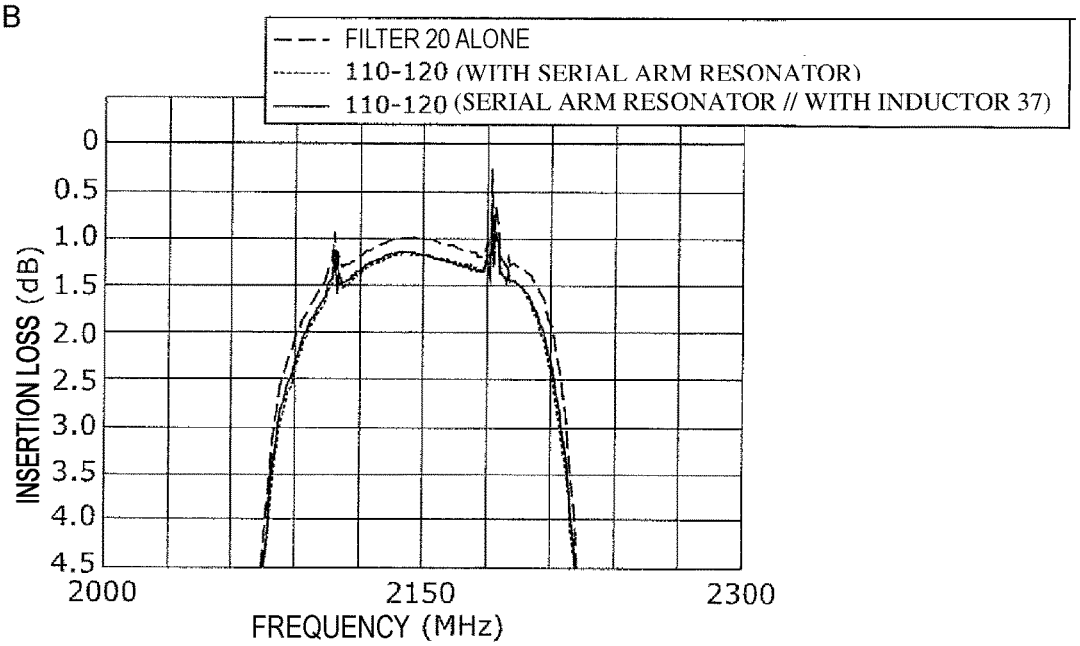
FIG. 7B is a graph illustrating the bandpass characteristics of a first filter according to the modified example of the first embodiment.

FIG. 7A is a diagram illustrating the circuit configuration of the multiplexer 1A according to the modified example of the first embodiment. FIG. 7B is a graph illustrating the bandpass characteristics of the filter 20. As illustrated in FIG. 7B, the filter 20 with addition of the parallel combination of the serial arm resonator 35 and the inductor 37 has a further improved insertion loss especially on the lower band side from the first passband compared with the filter 20 with addition of only the serial arm resonator 35.

Therefore, addition of the inductor 37 causes the attenuation band (first passband) of the filter 30 to be concentrated at high impedance, achieving improvement in the attenuation characteristics of the filter 30 and achieving improvement in the bandpass characteristics (insertion loss), in the first passband, of the filter 20. That is, both optimization of the impedance of the filter 20 connected to the common terminal 110 and optimization of the impedance of the filter 30 may be achieved. In addition, both optimization of the bandpass characteristics (insertion loss) of the filter 20 and optimization of the bandpass characteristics (insertion loss and attenuation characteristics) of the filter 30 may be achieved.

Second Embodiment

In the first embodiment, the inductive region of the serial arm resonator 35 covers the passband of the filter 20, thus achieving optimization of the impedance of the filters 20 and 30. In a second embodiment, the capacitive region of the serial arm resonator 35 covers the passband of the filter 20, thus achieving optimization of the impedance of the filters 20 and 30.

2.1 Configuration of Multiplexer 1B

Figure 8A:
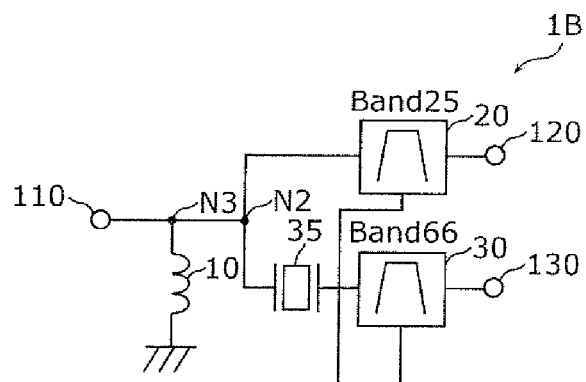
FIG. 8A is a diagram illustrating the circuit configuration of a multiplexer according to a second embodiment.
Figure 8B:
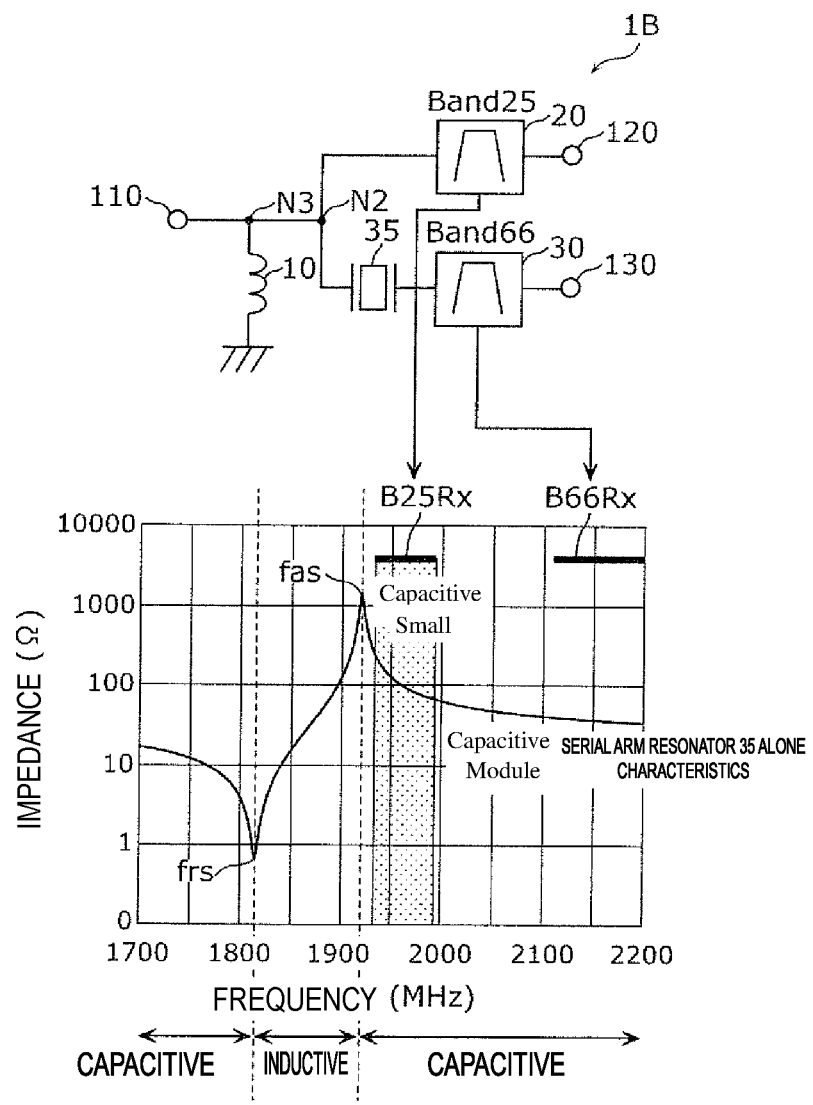
FIG. 8B is a graph illustrating the impedance characteristics of a serial arm resonator according to the second embodiment.

FIG. 8A is a diagram illustrating the circuit configuration of a multiplexer 1B according to the second embodiment. FIG. 8B is a graph illustrating the impedance characteristics of the serial arm resonator 35. As illustrated in FIG. 8A, the multiplexer 1B includes the common terminal 110 (first common terminal), the reception output terminal (first input/output terminal) 120, the reception output terminal (second input/output terminal) 130, the filters 20 and 30, the serial arm resonator 35, and an inductor 10.

The filter 20, which is an exemplary first filter, is connected between the common terminal 110 and the reception output terminal 120, and has the first passband different from the passbands of the filters 30 and 40.

The filter 30, which is an exemplary second filter, is connected between the common terminal 110 and the reception output terminal 130, and has the second passband different from the passbands of the filters 20 and 40.

The serial arm resonator 35, which is an exemplary impedance matching circuit disposed between the common terminal 110 and the filter 30, is the first acoustic wave resonator disposed in series on the path connecting the common terminal 110 to the filter 30.

The inductor 10, which is an exemplary impedance matching circuit disposed between the common terminal 110 and node N2 which is a connection node of the filters 20 and 30, is connected between the ground and node N3 on a path connecting the common terminal 110 to node N2. The inductor 10 may be disposed in series on the path. In addition, the inductor 10 may be a capacitor. Further, the inductor 10 may be optional.

The filters 20 and 30 are, for example, acoustic wave filters using SAWs. Alternatively, the filters 20 and 30 may be acoustic wave filters using BAWs, LC resonant filters, or dielectric filters.

As illustrated in FIG. 8A, in the second embodiment, the filter 20 is applied, for example, to a filter using Band 25 (receive band: 1930-1995 MHz) of LTE as the first passband; the filter 30 is applied, for example, to a filter using Band 66 (receive band: 2110-2200 MHz) of LTE as the second passband. In this case, the first passband of the filter 20 is positioned on the lower frequency side from the second passband of the filter 30. In this configuration, the multiplexer 1B is capable of transmitting radio-frequency receive signals in Band 25 and radio-frequency receive signals in Band 66 at the same time.

2.2 Impedance Characteristics of Multiplexer 1B

As illustrated in FIG. 8B, in the second embodiment, the serial arm resonator 35 has the resonant frequency frs, at which the impedance is minimum, and the anti-resonant frequency fas, at which the impedance is maximum. The resonant frequency frs is positioned on the lower frequency side from the anti-resonant frequency fas. In the case of the serial arm resonator 35 formed of an acoustic wave resonator, in the frequency band on the lower frequency side from the resonant frequency frs and the frequency band on the higher frequency side from the anti-resonant frequency fas, the impedance of the serial arm resonator 35 is capacitive. In contrast, in the frequency band on the higher frequency side from the resonant frequency frs and on the lower frequency side from the anti-resonant frequency fas, the impedance of the serial arm resonator 35 is inductive. In the capacitive frequency band on the higher frequency side from the anti-resonant frequency fas, as the frequency approaches the anti-resonant frequency fas, the impedance becomes less capacitive; as the frequency moves away from the anti-resonant frequency fas to the higher frequency side, the impedance becomes more capacitive.

As illustrated in FIG. 8B, in the multiplexer 1B according to the second embodiment, the anti-resonant frequency fas of the serial arm resonator 35 is positioned on the lower frequency side from the passband (in FIG. 8B, B25Rx) of the filter 20. The anti-resonant frequency fas of the serial arm resonator 35 is close to the low frequency end of the passband (in FIG. 8B, B25Rx) of the filter 20.

Figure 9A:
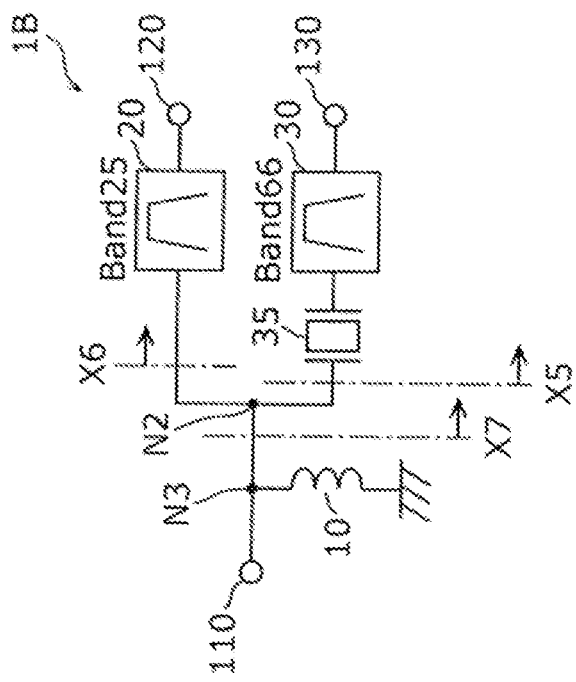
FIG. 9A is a diagram illustrating the circuit configuration of a multiplexer according to the second embodiment.

FIG. 9A is a diagram illustrating the circuit configuration of the multiplexer 1B according to the second embodiment. FIGS. 9B and 9C are Smith charts illustrating the impedance characteristics of the filters 30 and 20. As illustrated in FIG. 9A, a node between node N2 and the serial arm resonator 35 is referred to as node X5; a node between node N2 and the filter 20 is referred to as node X6; a node between node N2 and node N3 is referred to as node X7. The Smith chart in FIG. 9B illustrates only the impedance in the second passband of the filter 30 (near the reference impedance: in FIG. 9B, illustrated as B66 band) and the impedance in the given attenuation band (the first passband of the filter 20) of the filter 30 (near the outermost circle in the lower right quadrant: in FIG. 9B, illustrated as B25 band). The Smith chart does not illustrate the impedance in the other bands. The Smith chart in FIG. 9C illustrates only the impedance in the first passband of the filter 20 (near the reference impedance: in FIG. 9C, illustrated as B25 band) and does not illustrate the impedance in the other bands.

FIG. 9B illustrates the impedance (the coarse broken line) of the filter 30 alone as seen from node X5, the impedance (the fine broken line) of the filter 30 as seen from node X5 with series addition of a capacitive element instead of the serial arm resonator 35 (and without connection of the filter 20), and the impedance (the solid line) of the filter 30 as seen from node X5 with series addition of the serial arm resonator 35 (and without connection of the filter 20).

As illustrated in FIG. 8B, the anti-resonant frequency fas of the serial arm resonator 35 is positioned near the lower frequency side from the first passband of the filter 20. That is, the first passband (B25Rx) of the filter 20 is included in the capacitive region of the serial arm resonator 35. The second passband (B66Rx) of the filter 30 is also included in the capacitive region of the serial arm resonator 35. Thus, as illustrated in FIG. 9B, in the impedance characteristics of the filter 30 as seen from node X5, the impedance in the second passband (B66 band) with addition of the serial arm resonator 35 and the impedance in the second passband (B66 band) with addition of the capacitive element are shifted counterclockwise by the same amount on a constant resistance circle of the Smith chart due to the series addition of the capacitive impedance, compared with the impedance in the second passband (B66 band) of the filter 30 alone as seen from node X5.

In contrast, in the impedance characteristics of the filter 30 as seen from node X5 with series addition of the capacitive element, the impedance ($f_{L7}$ to $f_{H7}$) in the first passband (B25 band) is shifted counterclockwise on a constant resistance circle in the Smith chart due to series addition of the capacitive impedance of the capacitive element, compared with the impedance ($f_{L6}$ to $f_{H6}$) in the first passband of the filter 30 alone as seen from node X5.

Further, in the impedance characteristics of the filter 30 as seen from node X5 with series addition of the serial arm resonator 35, the impedance ($f_{L8}$ to $f_{H8}$) in the first passband (B25 band) is greatly shifted counterclockwise to the open side on the constant resistance circle in the Smith chart, compared with the impedance ($f_{L7}$ to $f_{H8}$) in the first passband of the filter 30 as seen from node X5 with series addition of the capacitive element. More specifically, in the impedance characteristics of the filter 30 as seen from node X5, as illustrated in FIG. 9B, a larger capacitive component of the serial arm resonator 35 is added in series at the high frequency end of the first passband (B25 band); a smaller capacitive component of the serial arm resonator 35 is added in series at the low frequency end of the first passband (B25 band). Therefore, the impedance in the first passband (B25 band) of the filter 30 with series addition of the serial arm resonator 35 is greatly shifted counterclockwise to the open side on the constant resistance circle in the Smith chart without a reduction in the reflection coefficient (from $f_{L6}$ to $f_{L8}$), from $f_{H6}$ to $f_{H8}$).

As a result, in the impedance characteristics of the filter 30 as seen from node X5 with addition of the serial arm resonator 35, the impedance ($f_{L8}$) at the low frequency end of the first passband (B25 band) has a small capacitance (large reactance). The impedance ($f_{H8}$) at the high frequency end of the first passband (B25 band) has a large capacitance (small reactance).

As illustrated in FIG. 9C, in the impedance characteristics of the filter 20 alone as seen from node X6, the impedance (from the low frequency end $f_{L9}$ to the high frequency end $f_{H9}$) in the first passband (in FIG. 9C, illustrated as B25 band) is positioned near the reference impedance. However, the impedance in the first passband of the filter 20 alone as seen from node X6 extends wide from the low frequency end ($f_{L9}$) to the high frequency end ($f_{H9}$).

In contrast, as illustrated in FIG. 9C, in the impedance characteristics of the filter 20 as seen from node X7, the impedance at the low frequency end of the first passband is shifted little clockwise on a constant conductance circle in the admittance chart due to parallel addition of a small capacitance caused by the serial arm resonator 35 ($f_{L9}$ to $f_{L10}$). In contrast, the impedance at the high frequency end of the first passband is greatly shifted clockwise on a constant conductance circle of the admittance chart due to parallel addition of a large capacitance caused by the serial arm resonator 35 ($f_{H9}$ to $f_{H10}$). As a result, in the impedance characteristics of the filter 20 as seen from node X7, the degree of concentration of winding of the first passband (B25 band) is improved.

Thus, the filter 20 with addition of the serial arm resonator 35 on the filter 30 side causes improved ripples in the first passband compared with the filter 20 without addition of the serial arm resonator 35 on the filter 30 side.

Therefore, addition of the serial arm resonator 35 on the filter 30 side causes the attenuation band (first passband) of the filter 30 to be shifted to the high impedance side, achieving improvement in the attenuation characteristics of the filter 30 and achieving improvement in the bandpass characteristics (ripples), in the first passband, of the filter 20. That is, the impedance in the passband and the attenuation band of the filter 30 may be optimized individually. Thus, both optimization of the impedance of the filter 20 connected to the common terminal 110 and optimization of the impedance of the filter 30 may be achieved. Therefore, both optimization of the bandpass characteristics (ripples) of the filter 20 and optimization of the bandpass characteristics (attenuation characteristics) of the filter 30 may be achieved.

As the difference, which is illustrated in FIG. 9B, between the capacitance of the impedance ($f_{L8}$) at the low frequency end of the first passband (B25 band) and the capacitance of the impedance ($f_{HS}$) at the high frequency end of the first passband (B25 band) becomes larger, the degree of concentration of winding, which is illustrated in FIG. 9C, of the first passband (B25 band) in the impedance characteristics of the filter 20, as seen from node X7, is improved. From the viewpoint of this, the frequency difference between the anti-resonant frequency fas of the serial arm resonator 35 and the low frequency end of the passband of the filter 20 (B25Rx) is desirably equal to or less than about 10 MHz.

The multiplexer 1B according to the second embodiment may have a configuration in which the resonant frequency frs of the serial arm resonator 35 is positioned on the lower frequency side from the first passband of the filter 20, and in which the anti-resonant frequency fas of the serial arm resonator 35 is included in the first passband of the filter 20. Even in this configuration, a large difference between the capacitance of the impedance ($f_{LS}$) at the low frequency end of the first passband (B25 band) and the capacitance of the impedance ($f_{HS}$) at the high frequency end of the first passband (B25 band) may be achieved. However, even in this case, the frequency difference between the anti-resonant frequency fas of the serial arm resonator 35 and the low frequency end of the passband of the filter 20 (B25Rx) is desirably equal to or less than about 10 MHz. Thus, the attenuation band (first passband) of the filter 30 is shifted to the high impedance side, achieving improvement in the attenuation characteristics of the filter 30 and achieving improvement in the bandpass characteristics (ripples) of the filter 20. Therefore, both optimization of the bandpass characteristics (ripples) of the filter 20 and optimization of the bandpass characteristics (attenuation characteristics) of the filter 30 may be achieved.

In the multiplexer 1B according to the second embodiment, the filter 20 may be applied, for example, to a filter using Band 1 (receive band: 2110-2170 MHz) of LTE as the first passband; the filter 30 may be applied, for example, to a filter using Band 3 (receive band: 1805-1880 MHz) of LTE as the second passband. In this case, the first passband of the filter 20 is positioned on the higher frequency side of the second passband of the filter 30. This case is provided on the condition of the relationship in which the anti-resonant frequency fas of the serial arm resonator 35 is positioned on the lower frequency side from the passband of the filter 20, and in which the frequency difference between the anti-resonant frequency fas of the serial arm resonator 35 and the low frequency end of the passband of the filter 20 (B1Rx) is equal to or less than about 10 MHz. This enables both optimization of the impedance of the filter 20 and optimization of the impedance of the filter 30 to be achieved, and may provide a multiplexer which is capable of transmitting radio-frequency receive signals in Band 1 and radio-frequency receive signals in Band 3 at the same time.

In the multiplexer 1B according to the second embodiment, the filter 20 may be applied, for example, to a filter using Band 40 (receive band: 2300-2400 MHz) of LTE as the first passband; the filter 30 may be applied, for example, to a filter using Band 3 (receive band: 1805-1880 MHz) of LTE as the second passband. In this case, the first passband of the filter 20 is positioned on the higher frequency side from the second passband of the filter 30. This case is provided on the condition of the relationship in which the anti-resonant frequency fas of the serial arm resonator 35 is positioned on the lower frequency side from the passband of the filter 20, and in which the frequency difference between the anti-resonant frequency fas of the serial arm resonator 35 and the low frequency end of the passband of the filter 20 (B40Rx) is equal to or less than about 10 MHz. This enables both optimization of the impedance of the filter 20 and optimization of the impedance of the filter 30 to be achieved, and may provide a multiplexer which is capable of transmitting radio-frequency receive signals in Band 40 and radio-frequency receive signals in Band 3 at the same time.

Other Embodiments

The multiplexer, the front-end module, and the communication device provided by the present disclosure are described by taking, as examples, the embodiments and the modified example. The present disclosure is not limited to the embodiments and the modified example described above. The present disclosure encompasses a different embodiment which is implemented by combining any components in the embodiments and the modified example, and a modified example which is obtained by making various changes, which are conceived by those skilled in the art without necessarily departing from the gist of the present disclosure, on the embodiments and the modified example described above. The present disclosure also encompasses various types of equipment including the multiplexer, the front-end module, and the communication device provided by the present disclosure.

The front-end module provided by the present disclosure may have a configuration in which, instead of the serial arm resonator 35 disposed between the filter 30 and node N2, a serial arm resonator is disposed between the common terminal 110 and node N2. According to this configuration, when multi-connection of the switch 50 is used to receive, at the same time, a radio-frequency receive signal passing through the filter 40 and one or both of a radio-frequency receive signal passing through the filter 20 and a radio-frequency receive signal passing through the filter 30, the impedance in the passband and the attenuation band of the filter 20 or 30 may be optimized individually. Thus, both optimization of the impedance of the filter 20 or 30 and optimization of the impedance of the filter 40 may be achieved.

The front-end module provided by the present disclosure may have a configuration in which, instead of the serial arm resonator 35 disposed between the filter 30 and node N2, a serial arm resonator is disposed between the selection terminal 50c of the switch 50 and the filter 40. According to this configuration, when multi-connection of the switch 50 is used to receive, at the same time, a radio-frequency receive signal passing through the filter 40 and one or both of a radio-frequency receive signal passing through the filter 20 and a radio-frequency receive signal passing through the filter 30, the impedance in the passband and the attenuation band of the filter 40 may be optimized individually. Thus, both optimization of the impedance of the filter 20 or 30 and optimization of the impedance of the filter 40 may be achieved.

For example, in the multiplexer, the front-end module, and the communication device according to the embodiments and the modified example described above, matching elements, such as an inductor and a capacitor, and switching circuits may be connected between the components. Examples of an inductor may include a wiring inductor using wires for connecting components.

The present disclosure may be widely used in communication equipment, such as a cellular phone, as a multiplexer, a front-end module, and a communication device applicable to a multi-band system.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A multiplexer comprising:
a first common terminal, a first input/output terminal, and a second input/output terminal;
a first filter that is connected between the first common terminal and the first input/output terminal;
a second filter that is connected between the first common terminal and the second input/output terminal, the second filter having a passband that is different than a passband of the first filter; and
an impedance matching circuit that is between the first common terminal and the second filter,
wherein the impedance matching circuit comprises a first acoustic wave resonator that is in series on a path connecting the first common terminal to the second filter,
wherein the second filter comprises an acoustic wave resonator, and
wherein the impedance matching circuit further comprises a first inductor that is between the first common terminal and the first acoustic wave resonator, and that is connected to the first acoustic wave resonator in series.

2. The multiplexer according to claim 1, wherein the impedance matching circuit further comprises a second inductor that is between the first common terminal and the second filter, and that is connected to the first acoustic wave resonator in parallel.

3. The multiplexer according to claim 1, wherein a frequency band that extends from a resonant frequency to an anti-resonant frequency of the first acoustic wave resonator at least partially overlaps the passband of the first filter.

4. The multiplexer according to claim 3, wherein the anti-resonant frequency of the first acoustic wave resonator is in the passband of the first filter.

5. The multiplexer according to claim 3, wherein the frequency band from the resonant frequency to the anti-resonant frequency of the first acoustic wave resonator completely overlaps the passband of the first filter.

6. The multiplexer according to claim 1, wherein an anti-resonant frequency of the first acoustic wave resonator has a lower frequency than the passband of the first filter.

7. The multiplexer according to claim 6, wherein a frequency difference between the anti-resonant frequency of the first acoustic wave resonator and a low frequency end of the passband of the first filter is equal to or less than 10 MHz.

8. The multiplexer according to claim 1, wherein a resonant frequency of the first acoustic wave resonator has a lower frequency than the passband of the first filter, and an anti-resonant frequency of the first acoustic wave resonator is in the passband of the first filter.

9. A front-end module comprising:
a third input/output terminal;
a switch that has a second common terminal, a first selection terminal, and a second selection terminal, and that is configured to simultaneous connect the second common terminal to the first selection terminal and to the second selection terminal;
the multiplexer according to claim 1, the first common terminal being connected to the first selection terminal; and
a third filter that is connected between the second selection terminal and the third input/output terminal, the third filter having a passband that is different than the passbands of the first and second filters.

10. A communication device comprising:
a radio-frequency signal processing circuit configured to process a radio frequency signal received or transmitted through an antenna; and
the multiplexer according to claim 1, the multiplexer being configured to transmit the radio frequency signal between the antenna and the radio-frequency signal processing circuit.

11. A communication device comprising:
a radio-frequency signal processing circuit configured to process a radio frequency signal received or transmitted through an antenna; and
the front-end module according to claim 9, the front-end module being configured to transmit the radio frequency signal between the antenna and the radio-frequency signal processing circuit.

12. A multiplexer comprising:
a first common terminal, a first input/output terminal, and a second input/output terminal;
a first filter that is connected between the first common terminal and the first input/output terminal;
a second filter that is connected between the first common terminal and the second input/output terminal, the second terminal having a passband that is different than a passband of the first filter; and
an impedance matching circuit that is between the first common terminal and the second filter,
wherein the impedance matching circuit comprises a first acoustic wave resonator that is in series on a path connecting the first common terminal to the second filter, and
wherein the impedance matching circuit further comprises an inductor that is between ground and a node on the path, the node being between the first common terminal and the first acoustic wave resonator.

* * * * *